United States Patent
Debard et al.

(10) Patent No.: US 9,647,619 B2
(45) Date of Patent: May 9, 2017

(54) MULTICHANNEL SPEAKER ENCLOSURE

(75) Inventors: Nicolas Debard, Margerie-Chantagret (FR); Benjamin Pares, Lyons (FR)

(73) Assignee: FOCAL JMLAB, La Talaudiere (FR)

( * ) Notice: Subject to any disclaimer, the term of this patent is extended or adjusted under 35 U.S.C. 154(b) by 299 days.

(21) Appl. No.: 13/825,911

(22) PCT Filed: Oct. 27, 2011

(86) PCT No.: PCT/FR2011/052510
§ 371 (c)(1),
(2), (4) Date: Mar. 25, 2013

(87) PCT Pub. No.: WO2012/059668
PCT Pub. Date: May 10, 2012

(65) Prior Publication Data
US 2013/0208916 A1     Aug. 15, 2013

(30) Foreign Application Priority Data
Nov. 3, 2010   (FR) ...................... 10 59059

(51) Int. Cl.
| H03G 3/00 | (2006.01) |
| H04R 3/14 | (2006.01) |
| H04R 1/26 | (2006.01) |

(52) U.S. Cl.
CPC ............... *H03G 3/00* (2013.01); *H04R 3/14* (2013.01); *H04R 1/26* (2013.01)

(58) Field of Classification Search
CPC ... H03G 3/00; H04R 3/14; H04R 3/04; H04R 3/12; H04R 1/26; H04S 7/307
See application file for complete search history.

(56) References Cited

U.S. PATENT DOCUMENTS

| 3,927,279 | A | * | 12/1975 | Nakamura et al. | ........... 381/320 |
| 4,181,819 | A | | 1/1980 | Cammack | |
| 4,627,094 | A | * | 12/1986 | Scholz | ................... G10K 15/12 |
| | | | | | 381/61 |
| 7,035,417 | B1 | * | 4/2006 | Packard | ........................ 381/94.1 |
| 2003/0215097 | A1 | | 11/2003 | Crutchfield | |
| 2005/0207593 | A1 | * | 9/2005 | Praestgaard et al. | ........... 381/99 |
| 2006/0159275 | A1 | * | 7/2006 | Kobayashi | ............... H04R 1/24 |
| | | | | | 381/17 |
| 2008/0170722 | A1 | | 7/2008 | Takata et al. | |
| 2008/0219476 | A1 | * | 9/2008 | Okabayashi | .................. 381/119 |
| 2011/0206224 | A1 | * | 8/2011 | Augustyn | ................. H03G 9/14 |
| | | | | | 381/302 |

OTHER PUBLICATIONS

European Patent Office, International Search Report for corresponding International Application No. PCT/FR2011/052510 dated May 23, 2012 in the French and English languages (4 pgs).

* cited by examiner

*Primary Examiner* — Ping Lee
(74) *Attorney, Agent, or Firm* — Harris Beach PLLC

(57) ABSTRACT

The invention relates to a speaker enclosure comprising at least two channels, wherein a first and second channel are respectively dedicated to separate and adjacent first and second frequency bands, each of said channels including a filtering stage supplied by the control signal and a speaker unit, wherein said speaker enclosure is characterized in that said channels also include means for simultaneously: disconnecting the first channel from the control signal; and modifying the filtering stage of the second channel so as to modify the frequency response thereof.

10 Claims, 5 Drawing Sheets

MULTICHANNEL SPEAKER ENCLOSURE

CROSS-REFERENCE TO RELATED APPLICATIONS

This application is a national stage application under 35 U.S.C. §371 of PCT Application No. PCT/FR2011/052510, filed Oct. 27, 2011, which claims priority to and the benefit of French Application No. 1059059 filed on Nov. 3, 2010, which are incorporated herein by reference in their entirety.

TECHNICAL BACKGROUND

The present invention relates to the field of speaker systems. It more specifically aims at a type of speaker system including arrangements enabling to use them for several types of sound rendition, to simulate a listening on various types of equipment.

DISCUSSION OF PRIOR ART

Generally, in recording studios, or more generally when audio tracks are mixed for the production and the playing of audio works, the best listening quality is desired. This is why high-performance speaker systems or studio monitors are used, to have as faithful as possible a sound rendition, since it will be, in a way "set" in a physical or computer support before the playing.

To be as close as possible to absolute fidelity, speaker systems most of the time have several channels, each including one or several drivers specific to each frequency band to be reproduced. There are at least two channels generally dedicated to the reproduction of low and high sounds. In certain systems, the number of channels may rise up to six, with a frequency spectrum segmentation which may be broken up as follows: subwoofer (frequencies lower than 50 Hz), woofer (<150 Hz), low midrange (<600 Hz), midrange (<2,500 Hz), tweeter (<20,000 Hz), and super-tweeter (>20,000 Hz).

Such speaker systems have a highly detailed transmission, similar to those that may be heard by users equipped with high-end equipment.

It is however important for a sound engineer or, more generally, the person performing the mixing, to be able to verify that the sound rendition will also be of good quality when it will be played via sound equipment having a different sound rendition, and in particular on systems only having two channels, or even a single one. As an illustration, one of the aims of the mixing is to provide a sound rendition of a musical work which is acceptable whether it is played on a high-fidelity system with advanced four-way speakers, or played on a multimedia system connected to a computer, or by the audio system of a vehicle, or again by a simple clock radio driver.

Thus, a simple way of verifying that the signal emitted by a three-way speaker also has a sufficient quality on two-way speakers is to install these two types of speakers in the listening room and to successively connect one or the other of the two speakers. This solution is of course bulky and unpractical. In other words, to verify the quality of the transfer on different types of speakers, that is, speakers differing in terms of number of channels, of tonal balance, and of reproduced frequency band, it is necessary to install as many pairs of speakers and to successively connect each of the pairs.

Another solution comprises inserting an equalization in the filtering portion of the speaker, which modifies its tonal balance and thus gives a perception of another sound rendition. However, this type of speaker always emits on all its channels, which does not enable to take into account the specificities of a speaker having a smaller number of channels than the studio monitor used. Such specificities are among others the group delay in low frequencies and the Doppler effect due to a large-amplitude motion of the woofer membrane disturbing the midrange.

Document US 2008/0170722 describes a two-way speaker which may operate according to two modes, that is, a mode where the two channels are active and a specific mode where only the low frequency channel is operational, the high-frequency channel having been disconnected. Such a speaker does not provide a sound rendition of the entire audible spectrum when it operates in this specific mode.

DISCUSSION OF THE INVENTION

A problem that the invention aims at solving thus is to be able to obtain several type of different sound renditions by means of a single speaker system, by especially obtaining a rendition identical to that of a two-way speaker by means of a three-way speaker to implement a so-called "voicing" mode.

The invention thus relates to a speaker system comprising at least two channels, wherein a first and a second channels are respectively dedicated to a first and to a second different adjacent frequency bands, that is, bands having a common or close border. It may for example be the frequency band dedicated to low frequencies and the band dedicated to low medium frequencies, or again to medium and high frequencies.

Each channel especially comprises a filtering stage powered by the control signal, as well as a driver, and possibly an amplifying stage. This speaker comprises means for disconnecting the first channel from the control signal.

According to the invention, this speaker system characterizes in that it also comprises means for, simultaneously to the disconnection of the first channel from the control signal, modifying the filtering stage of the second channel to modify its frequency response, and displacing the cut-off frequency of the second channel towards the frequency band of the channel which has been disconnected. Such a modification of the frequency response may also come along with a modification of the tonal balance.

In other words, starting from a multi-way speaker system, the invention enables to disconnect one or several drivers dedicated to specific frequency bands. Simultaneously, the filtering of the channels remaining active is changed, for example, to take charge of part of the frequencies reproduced by the disconnected drivers, and at least partially compensate for these disconnections to generally cover most of the audible spectrum. Thereby, the sound rendition of the channels remaining active is modified to make it closer to that of a sound system which is desired to be emulated.

Thus, in the specific case of a three-way speaker, the invention enables to disconnect the woofer, which is absent in two-way speakers, so that no sound is emitted by this driver. Complementarily, the midrange filtering is modified to take into account part of the low frequencies conventionally reproduced on the woofer.

In other words, a playing by the tweeter and the midrange driver only is provided, due to the powering off of the woofer. This powering-off is however performed by integrating, in the power supply signal of the midrange driver, frequencies which would originally be reproduced by the woofer.

The modification of the filtering of the remaining channel(s) may be performed by combining multiple functions such as high-pass, low-pass, all-pass filterings, or functions of "low-shelving" type, or again actions on the phase. Such combinations may be varied according to the desired sound renditions. In the case where the filtering is modified with no modification of constant cut-off frequencies, but with a modification of the tonal balance, "accidents" may be introduced in the frequency response, at specific locations of the spectrum, defined to obtain a sound rendition identical or similar to that of the sound system which is desired to be emulated.

In a specific embodiment, when the speaker operates with its three active channels, the filtering stage of the second channel, that is, generally, the midrange channel, may comprise a high-pass filter, having a low cut-off frequency $F_{OFF}$. When the speaker is used in the mode only comprising two channels, this filtering stage may be modified to comprise a high-pass filtering with a low cut-off frequency $F_{ON}$ smaller than $F_{OFF}$, advantageously combined with a constant attenuation at a frequency $F_{LS}$ smaller than $F_{ON}$.

In other words, the filtering frequency of the stage dedicated to midrange frequencies sees its low cut-off frequency decreased when the speaker operates in "voicing" mode. Complementarily, the filtering stage, modified when the voicing function is activated, comprises a constant attenuation from a frequency $F_{LS}$ smaller than $F_{ON}$. Thereby, midrange frequencies are somewhat attenuated to the benefit of low frequencies which, on the contrary, should be slightly amplified to have a satisfactory sound rendition thereof, through the driver dedicated to the medium frequency.

In certain cases, according to the extent of the bandwidths of the concerned channels, it may be useful to modify the filtering slopes of the drivers which keep on emitting, which enables to obtain a different sound rendition. Indeed, modifying the filtering slopes results (among others) in modifying the power present in the cut-off band, but also in modifying the directional lobes of the speaker, and in modifying the group delay of the system, around and below the crossover point. This takes part in the modification of the general acoustic behavior of the speaker in "voicing" mode, with respect to its original behavior. The modification of the filtering slopes is obtained by the addition or the removal of high-pass and/or low-pass filter cells to the filtering cells already present. It may further also be advantageous to combine them with one or several all-pass filter cells to adjust the phasing of the two drivers at the crossover point.

The like principle may be symmetrically adopted in the case where the first channel, which is cut off in "voicing" mode, corresponds to a higher frequency band than the channel which is modified to compensate for it. In this case, the low-pass filtering of the second channel is modified by raising its high cut-off frequency $F'_{ON}$. It is also possible to add a "low shelving"-type filtering stage providing a frequency attenuation below a reference frequency $F'_{LS}$ located above the high cut-off frequency of the modified low-pass filter.

According to a specific embodiment, each channel which is not disconnected when the "voicing" mode is active may comprise two different filtering circuits supplied at their input with the same signal and having their outputs alternately connected to the driver of the concerned channel, according to the state of a switch enabling to activate or to deactivate the "voicing" mode. In practice, such a switching may occur in different ways, that is, either mechanically, electromechanically, or, in preferred fashion, by actuating static switches associated with the filtering stages and manually or electronically controlled.

In other words, the speaker comprises electronic circuits ensuring the different filtering functions dedicated to the stage of the driver integrated to the channels which are not disconnected in active "voicing" mode, which are alternately actuated, excluding each other according to the activation of a member provided for this purpose on the speaker, or an offset electronic control.

The invention may be generalized to cases where the speaker is capable of providing more than two sound renditions, in which case each channel then comprises as many filtering stages as there are possible modes, similarly switchable.

In practice, the filterings of each channel may be performed by using passive, active circuits, or digital filtering techniques, or a combination of these different modes, if needed. The filtering stages may be implanted in the very frame of the speaker, or in a secondary package, without departing from the context of the present invention.

BRIEF DESCRIPTION OF THE DRAWINGS

The way to implement the present invention, as well as the resulting advantages, will better appear from the description of the following embodiment, based on the accompanying drawings, among which.

DESCRIPTION OF EMBODIMENTS

Figure 1:
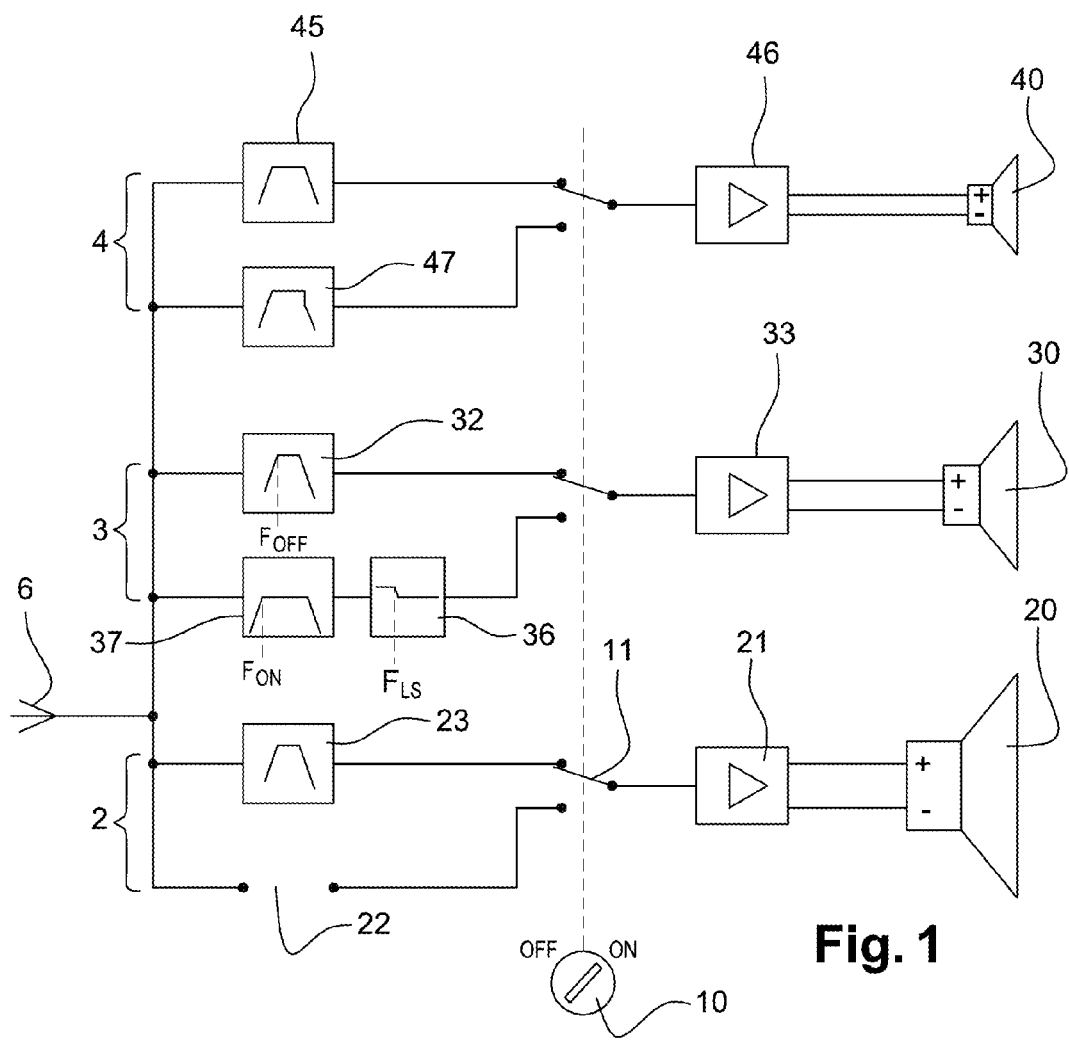
FIG. 1 is a simplified electric diagram of a speaker according to the present invention.

As illustrated in FIG. 1, speaker 1 formed according to the invention has three channels 2, 3, 4 intended to each power a driver, that is, a first driver 20 dedicated to the reproducing of low-frequency sounds, a second driver 30, of smaller diameter, dedicated to the reproduction of midrange frequencies, and a third driver 40 or tweeter assigned to the reproduction of high sounds.

Each of these channels 2, 3, 4 is supplied with input signal 6. Signal 6 is applied to each of the channels, which each comprise their own filtering circuit.

Thus, tweeter channel 4 has a filtering stage which comprises a bandpass filter 45, and a conventionally-designed amplifier 46. In the form illustrated in FIG. 1, the tweeter channel comprises a second optional filtering stage 47, which is operative when the "voicing" mode is active. Filtering 47 has a frequency response different from filtering 45, to decrease the sound rendition quality, in order to simulate a sound system of lower fidelity, when the "voicing" mode is active.

Woofer channel 2 also has a filtering stage, which comprises a bandpass filter 23, having a low cut-off frequency on the order of a few tens of Hertz and a high cut-off frequency approximately ranging from 100 to 200 Hz, intended to avoid the overlapping with the frequency band dedicated to midrange frequency channel 3.

Downstream of filtering stage 23 is contact 11 of a switch 10 which enables to connect the output of this filtering stage to amplifier 21, or to disconnect filtering stage 23, as shown by open circuit 22, and more generally by making channel 2 of the woofer inactive.

The filtering circuit assigned to second channel 3, or midrange channel, comprises two stages 32, 34 which are active when the "voicing" mode is respectively activated or not. The active stage when the "voicing" mode is deactivated comprises a filter of bandpass type, with a high cut-off frequency intended to avoid an overlapping with the frequency band assigned to tweeter channel 4, which is typically on the order of several thousand Hertz. This filter has a cut-off frequency $F_{OFF}$, enabling to avoid a frequency overlapping with woofer channel 2 when the latter is active, that is, when the "voicing" mode is deactivated.

Filtering circuit 34, active when the "voicing" mode is operative, comprises a low-pass filtering 37, having a low cut-off frequency $F_{ON}$ lower than frequency $F_{OFF}$ of filter 32 active when the "voicing" mode is deactivated.

Typically, cut-off frequency $F_{ON}$ may be on the order of 100 Hertz, to be compared with a 200-Hertz frequency $F_{OFF}$ when the midrange channel is nominally used.

Filtering stage 34 also comprises an attenuator 36, of low shelving type, having a critical frequency $F_s$ enabling to attenuate the frequencies covering the midrange as well as a good part of the low frequencies, while keeping a predominance of the subwoofer segment. This takes part in optimizing the acoustic coupling of the channels.

The two filtering stages 32, 34 are connected to two switch contacts 10, to be alternately connected to a conventionally-designed amplifier 33. Thus, when switch 10 enabling to select the "voicing" mode is in "off" position, woofer channel 2 is supplied and midrange channel 3 comprises a filtering stage formed of bandpass filter 32.

Conversely, when the "voicing" mode is activated, low channel 2 is disconnected and the filtering of midrange channel 3 combines bandpass filter 37 and "low shelving" stage 36, which is connected to amplifier 33.

Figure 2:
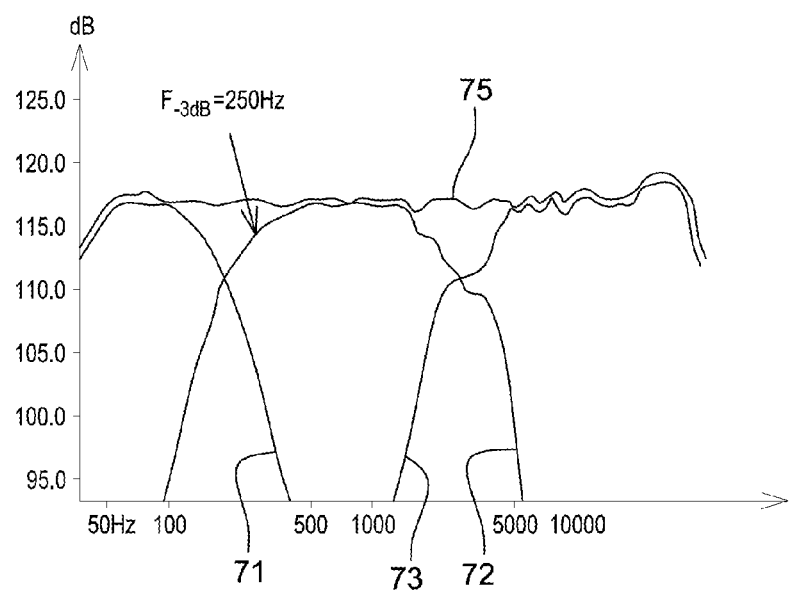
FIGS. 2 and 3 are diagrams illustrating the frequency responses of each of the channels of a speaker according to the invention, shown when the "voicing" function is respectively deactivated and activated.
Figure 3:
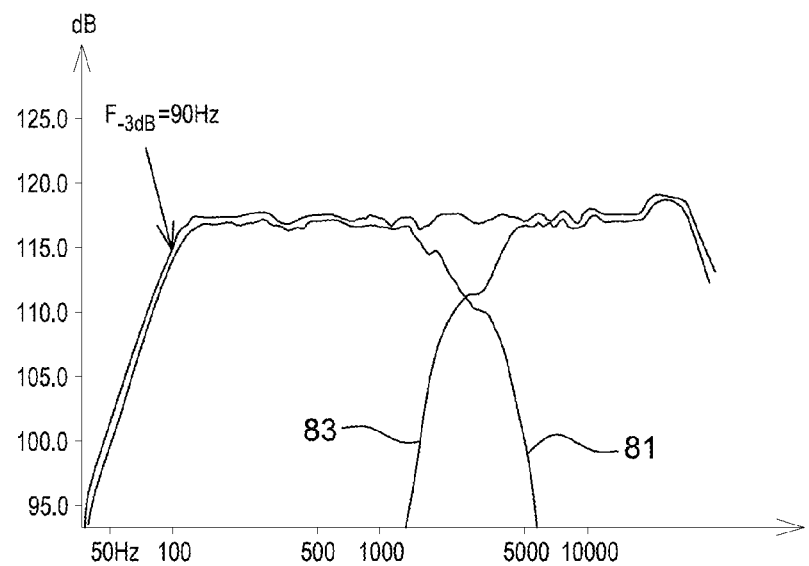

The frequency responses according to the two operation embodiments are illustrated in FIGS. 2 and 3.

Thus, it can be observed in FIG. 2 that each of the channels has a specific frequency response, the woofer channel being shown by curve 71, the midrange channel being shown by curve 72, and the tweeter channel being shown by curve 73. The general response corresponds to curve 75, which clearly extends in the low-frequency band.

It should be noted that the −3 dB cut-off frequency for midrange channel 3 is at a frequency on the order of 250 Hertz. When the "voicing" mode is activated as illustrated in FIG. 3, the midrange channel has a widened frequency response, shown by curve 81. The tweeter channel keeps the same frequency response, shown by curve 83.

It can be observed that the frequency response of the medium channel has a much lower cut-off frequency, on the order of approximately 90 Hertz, due to high-pass filtering 35 of stage 34, with a cut-off frequency $F_{ON}$ on the order of 100 Hertz. This embodiment is advantageous for the emulation of "multimedia"-type two-way systems, which have a frequency response with a small extension at low frequencies.

Of course, the different shown values and curves shapes have been provided as an indication only, and the invention encompasses other variations where these values and shapes are adapted according to the geometries and other characteristics of the speaker.

Figure 4:
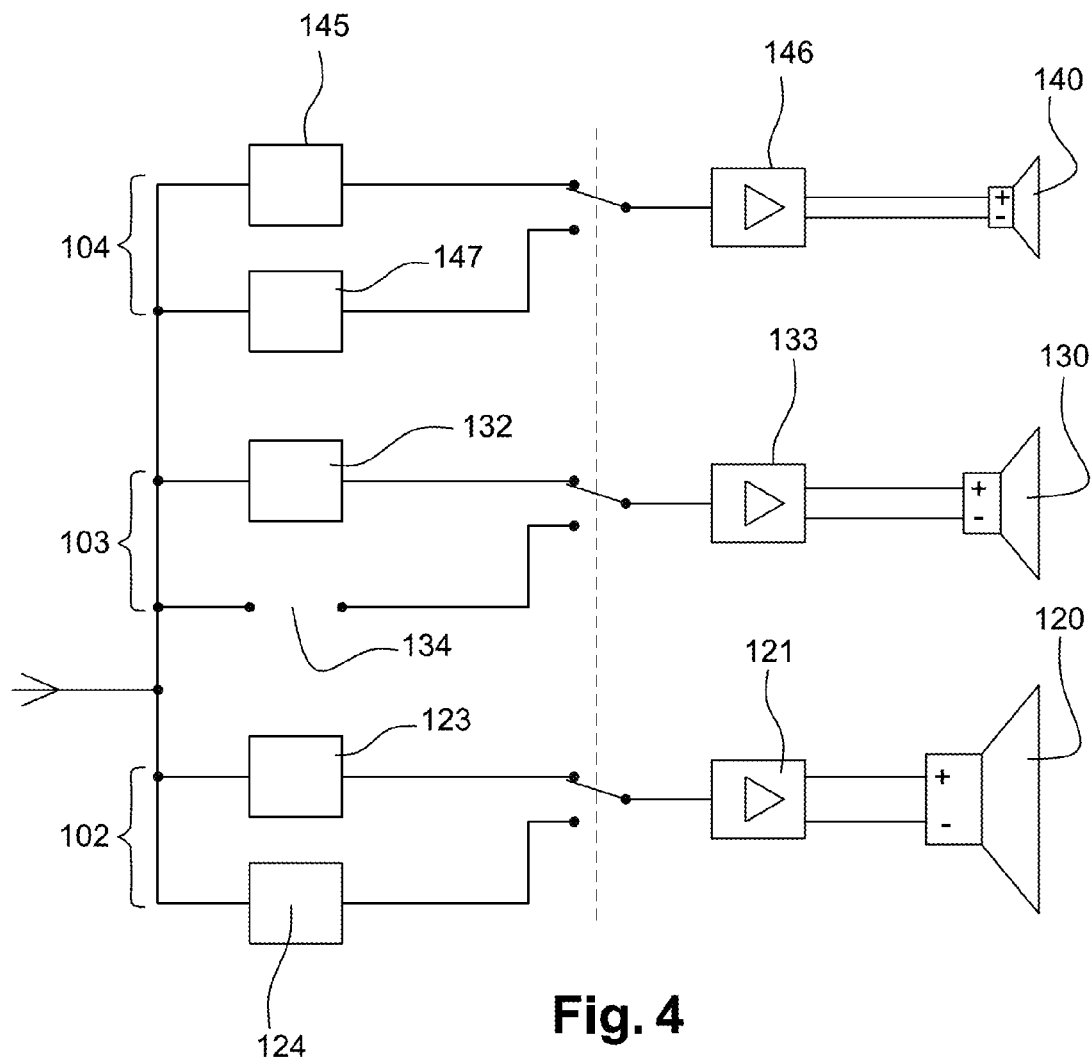
FIGS. 4 to 7 are simplified electric diagrams of speakers according to different execution modes of the invention.

The principle of the invention may be applied in other embodiments. Another example is illustrated in FIG. 4, where midrange channel 103 is disconnected (as shown by open circuit 134) when the "voicing" mode is activated. In this case, filtering stage 124 of woofer channel 102 used in "voicing" mode has a frequency response extending upwards, as compared with filtering stage 123 operative when the "voicing" mode is inactive. It is also possible for the filtering of high-frequency channel 104 to be modified, so that the low cut-off frequency of stage 147 is lower than that of stage 145 operative when the "voicing" mode is not activated.

This type of speaker for example enables to emulate small sound systems, which are very demonstrative for low-frequencies, but which have a low definition in the midrange.

Figure 5:
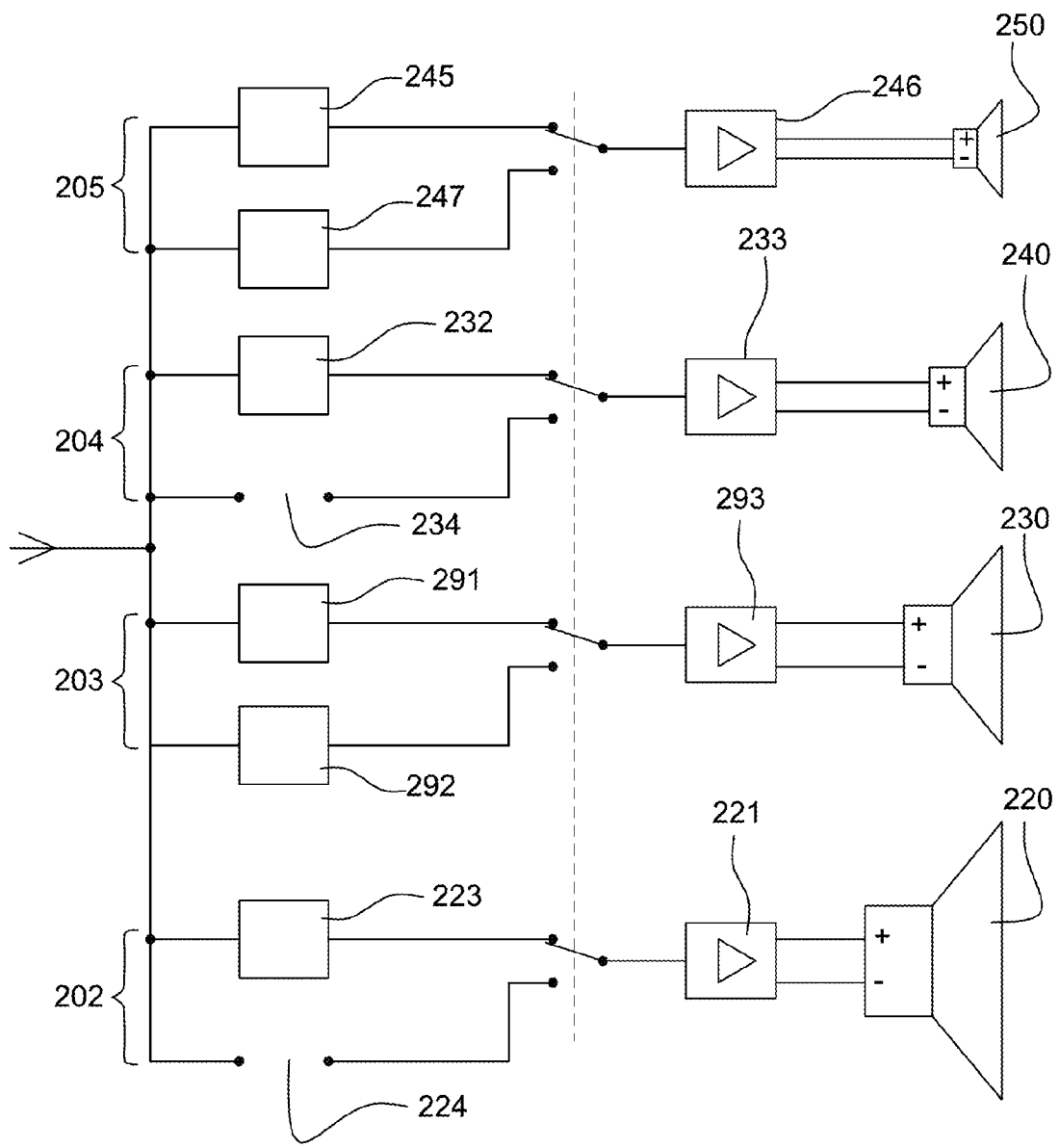

In the example illustrated in FIG. 5, the speaker has four channels, that is, a low-frequency channel 202, supplying a woofer 220, a channel 203 dedicated to the low-midrange, supplying driver 230, a channel 204 dedicated to the midrange supplying driver 240, and a channel 205 supplying a "tweeter". In nominal mode, that is, when all channels are operating, each channel has its filtering stage 223, 291, 232, 245 enabling to make the best of the performance of the corresponding drivers 220, 230, 240, 250.

When the "voicing" mode is activated, midrange channel 204 and woofer channel 202 are disconnected, as shown by the insertion of open circuits 224, 234. Similarly, as in FIG. 1, filtering 292 then applied to low midrange channel 203 enables to take charge of part of the frequencies of woofer channel 202, now inactive. Similarly, filtering 247 of tweeter channel 205 has a low cut-off frequency which is lowered with respect to filtering stage 245, so that the tweeter channel emits part of the medium frequencies.

This type of assembly especially enables to emulate vehicle audio systems.

Figure 6:
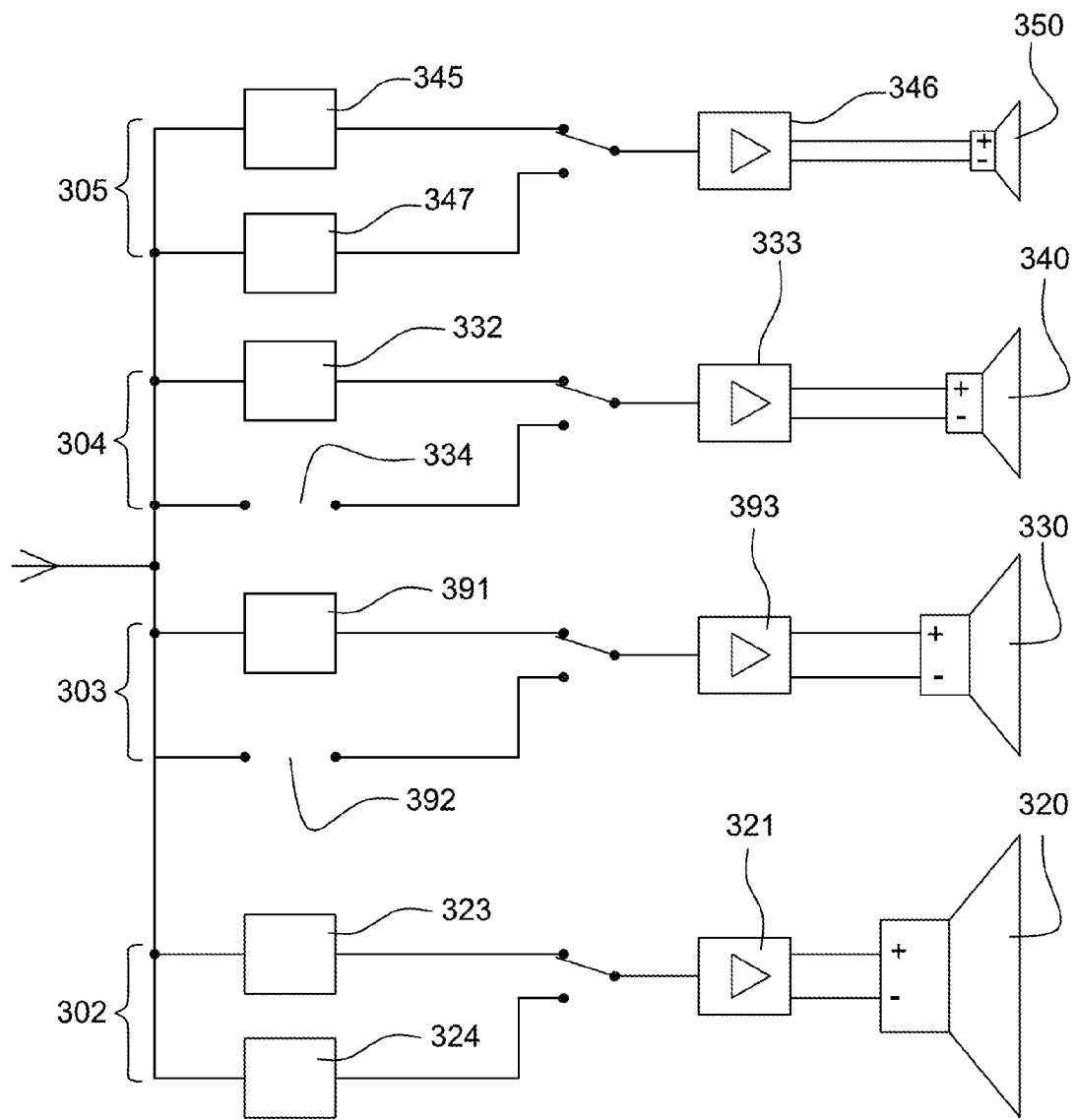

In the example illustrated in FIG. 6, the speaker also comprises four channels 302, 303, 304, 305. In nominal mode, that is, when all channels are operating, each channel has its filtering stage 323, 391, 332, 345 enabling to make the best of the performance of the corresponding drivers 320, 330, 340, 350.

When the "voicing" mode is activated, midrange channel 304 and low midrange channel 303 are disconnected, as shown by the insertion of open circuits 334, 392. Similarly, as in FIG. 4, filtering 324 then applied to woofer channel 302 enables to take charge of part of the frequencies of low midrange channel 303, now inactive. Similarly, filtering 347 of the tweeter channel has a low cut-off frequency which is lowered with respect to filtering stage 345, so that the tweeter range emits part of the medium frequencies.

Figure 7:
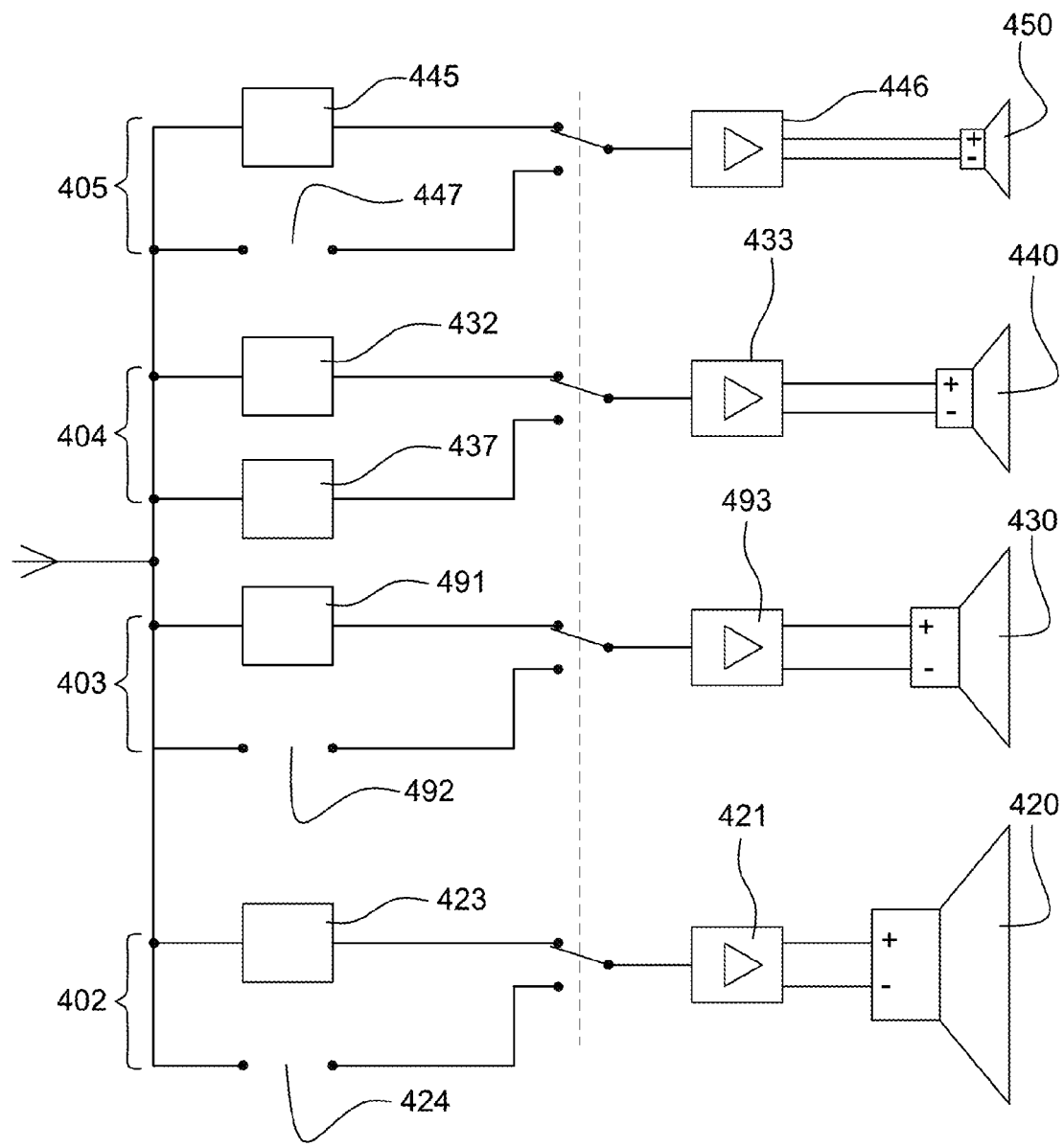

In the example illustrated in FIG. 7, the speaker also comprises four channels 402, 403, 404, 405. In nominal mode, that is, when all channels are operating, each channel has its filtering stage 423, 491, 432, 445 enabling to make the best of the performance of the corresponding drivers 420, 430, 440, 450.

When the "voicing" mode is activated, only midrange channel 404 remains operative, while the three other channels 402, 403, 405 are disconnected as shown by the insertion of open circuits 447, 492, 424. In this case, the sound rendition is that of a single driver, which enables to emulate sound systems of small household equipment, such as clock radios, for example. Filtering stage 437 modified for the midrange channel may be selected to provide the sound rendition closest to that of the device to be emulated. This filtering can be deduced from filtering 432 operative in nominal mode according to several principles. In the case where the device to be emulated has a small bandwidth, only the tonal balance is adapted, while keeping the cut-off frequencies. "Accidents" may be added to the frequency response, to create a difference with the frequency response of filtering 432, which has a relatively constant plateau between cut-off frequencies. It is also possible to widen the bandwidth, upwards and/or downwards according to the desired characteristics.

As a result of the foregoing, the speaker according to the invention enables to switch between a nominal operation using all the available channels and a mode with a decreased number of channels, where some drivers dedicated to the maintained channels have a widened frequency response. Thereby, the result of the sound take or more generally of the sound reproduction may be assessed while verifying the quality of transfer on an system emulation comprising a decreased number of channels.

The invention claimed is:

1. A multi-way speaker comprising:
   a speaker enclosure of a multi-way speaker;
   at least two channels disposed within said speaker enclosure, wherein a first channel and a second channel are respectively dedicated to a first frequency band and a second different frequency band adjacent said first frequency band, the frequency band of the second channel higher than the frequency band of the first channel, each of these channels comprising a filtering stage supplied with an input signal and a driver;
   a first channel filter of said multi-way speaker, said first channel filter electrically coupled to said input signal;
   a second channel filter of said multi-way speaker, said second channel filter electrically coupled to said input signal having a first cut-off frequency;
   a different second channel filter electrically coupled to said input signal having a displaced cut-off frequency;
   a switch of said multi-way speaker, said switch having a high fidelity position and a lower fidelity position, said switch having a first switch section and at least a second switch section both switched substantially together so that:
      in said high fidelity position said first switch section couples said first channel to said input signal via said first channel filter, and said second switch section couples said second channel to said second channel filter, and
      in said lower fidelity position, said first switch section electrically disconnects said input signal from said first channel, and said at least said second switch section couples said second channel to said different second channel filter so that a frequency response of said second channel is modified so that a cut-off frequency of said second channel is displaced towards said first frequency band;
   wherein the filtering stage of the second channel comprises a high-pass filter, with a low cut-off frequency $F_{OFF}$ and in that the modified filtering stage of the second channel comprises a high-pass filter with a low cut-off frequency $F_{ON}$ smaller than $F_{OFF}$; and
   wherein the modified filtering stage of the second channel further comprises a low shelving attenuation.

2. The multi-way speaker of claim 1, wherein the modification of the frequency response comprises modifying the tonal balance on all or part of the bandwidth.

3. The multi-way speaker of claim 1, characterized in that the second channel comprises two filtering circuits supplied at their input with the same signal, and having their outputs alternately connected to the driver according to the state of a switch.

4. The multi-way speaker of claim 1, wherein said multi-way speaker further comprises at least three or more channels and at least three or more switch sections corresponding to each of said three or more channels.

5. The multi-way speaker of claim 1, wherein said switch of said multi-way speaker comprises a single physical switch having at least two switch sections.

6. A multi-way speaker comprising:
   a speaker enclosure of a multi-way speaker;
   at least two channels disposed within said speaker enclosure of said multi-way speaker, wherein a first channel and a second channel are respectively dedicated to a first frequency band and a second different frequency band adjacent said first frequency band, the frequency band of the second channel higher than the frequency band of the first channel, each of these channels comprising a filtering stage supplied with an input signal and a driver;
   a switch means of said multi-way speaker for substantially simultaneously disconnecting the first channel from said input signal, and modifying a frequency response filtering stage of the second channel by displacing the cut-off frequency of the second channel towards the frequency band dedicated to the first channel;
   wherein the filtering stage of the second channel comprises a high-pass filter, with a low cut-off frequency $F_{OFF}$ and in that the modified filtering stage of the second channel comprises a high-pass filter with a low cut-off frequency $F_{ON}$ smaller than $F_{OFF}$; and
   wherein the modified filtering stage of the second channel further comprises a low shelving attenuation.

7. The multi-way speaker of claim 5, wherein the modification of the frequency response by said switch means comprises modifying the tonal balance on all or part of the bandwidth.

8. The multi-way speaker of claim 5, wherein the second channel comprises two filtering circuits supplied at their input with the same signal, and having their outputs alternately connected to the driver according to the state of a switch of said switch means.

9. A multi-way speaker of claim 5, further comprising at least one additional channel having a filtering band modified by said switch means.

10. The multi-way speaker of claim 5, wherein said switch means of said multi-way speaker comprises a single physical switch having at least two switch sections.

* * * * *